(12) United States Patent
Kuwabara

(10) Patent No.: US 9,801,314 B2
(45) Date of Patent: Oct. 24, 2017

(54) POWER SOURCE APPARATUS

(71) Applicant: FUJI ELECTRIC CO., LTD., Kawasaki-shi, Kanagawa (JP)

(72) Inventor: Takashi Kuwabara, Hino (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/276,830

(22) Filed: Sep. 27, 2016

(65) Prior Publication Data

US 2017/0135251 A1    May 11, 2017

(30) Foreign Application Priority Data

Nov. 6, 2015  (JP) ................. 2015-218534

(51) Int. Cl.

| | | |
|---|---|---|
| H05K 7/20 | (2006.01) |
| H02M 1/14 | (2006.01) |
| H05K 1/14 | (2006.01) |
| H05K 1/18 | (2006.01) |
| H02M 7/00 | (2006.01) |
| H02M 1/32 | (2007.01) |

(52) U.S. Cl.
CPC ........ *H05K 7/20909* (2013.01); *H02M 1/143* (2013.01); *H02M 7/003* (2013.01); *H05K 1/14* (2013.01); *H05K 1/181* (2013.01); *H05K 7/209* (2013.01); *H02M 2001/327* (2013.01); *H05K 2201/04* (2013.01); *H05K 2201/10015* (2013.01)

(58) Field of Classification Search
CPC .. H01G 9/26; H01G 9/28; H01G 4/38; H05K 7/209; H05K 7/20909; H05K 2201/10015; H05K 7/20; H05K 1/14; H02M 1/143; H02M 1/14
USPC .......................... 361/695, 704, 967; 257/713
See application file for complete search history.

(56) References Cited

U.S. PATENT DOCUMENTS

| | | | | |
|---|---|---|---|---|
| 5,930,112 A | * | 7/1999 | Babinski ............... | H02M 7/003 361/695 |
| 2014/0198455 A1 | * | 7/2014 | Masuda ................. | H05K 7/209 361/720 |

FOREIGN PATENT DOCUMENTS

| | | |
|---|---|---|
| JP | 2008-166531 A | 7/2008 |
| JP | 2009-044842 A | 2/2009 |

\* cited by examiner

*Primary Examiner* — Jayprakash N Gandhi
*Assistant Examiner* — Mandeep S Buttar
(74) *Attorney, Agent, or Firm* — Rabin & Berdo, P.C.

(57) ABSTRACT

A first printed circuit board on which a heatsink having a discrete semiconductor device attached to it and first capacitors for smoothing an electric current after a conversion from AC to DC are mounted is arranged in the horizontal direction of a bottom portion of a device casing. On the first printed circuit board, various electronic components such as a resistor, a diode, a capacitor, a coil, etc. are mounted in addition to the heatsink and the first capacitors. Further, in an in-device-casing vacant space in an upper portion of the heatsink mounted on the first printed circuit board, a second printed circuit board on which second capacitors for performing smoothing upon a conversion from AC to DC are mounted is arranged orthogonally to the first printed circuit board in the device spacing.

5 Claims, 3 Drawing Sheets

POWER SOURCE APPARATUS

CROSS REFERENCE TO RELATED APPLICATION

This application is based upon and claims the benefit of priority of the prior Japanese Patent Application No. 2015-218534, filed on Nov. 6, 2015, the entire contents of which are incorporated herein by reference.

FIELD

The present invention is related to a power source apparatus that forcibly air-cools a heatsink etc. by suctioning the outer air by using a fan.

BACKGROUND

Patent Documents 1 and 2 below disclose techniques of using cooled wind from a fan to provide efficient and forcible air-cooling for a heatsink to which a semiconductor device is attached.

Patent Document 1 provides a heat dissipation plate to a portion above the top surface of a heatsink to which a semiconductor device is attached, and allows cooled wind (outer air) suctioned by a fan to pass through the space between that heat dissipation plate and a printed circuit board.

Patent Document 2 forms hollow spaces in a plurality of bus bars, and allows cooled wind (outer air) suctioned by a fan to pass through the formed hollow spaces.

The techniques disclosed by Patent Documents 1 and 2 use a heat dissipation plate or a bus bar for the entire air channel (or part of it) of the cooled wind from the fan, resulting in a larger size or a higher price for the device, which is problematic.

Patent Document 1: Japanese Laid-open Patent Publication No. 2009-044842

Patent Document 2: Japanese Laid-open Patent Publication No. 2008-166531

SUMMARY

It is an object of the present invention to provide a power source apparatus that efficiently suppresses a temperature increase in the heat generating member when the heat generating member is forcibly air-cooled with outer air suctioned by a fan and that realizes a reduction in size and cost of the device In order to solve the above problem, embodiments of the invention include a power source apparatus provided with at least a heatsink to which a discrete semiconductor device is attached, first and second capacitors made of electrolytic capacitors for DC smoothing, and a cooling fan for forcibly air-cooling the heatsink and the first and second capacitors. The power source apparatus includes a first printed circuit board on which the heatsink and the first capacitors are mounted, and a second printed circuit board on which the second capacitors are mounted. The first and second printed circuit boards are arranged so that the first and second printed circuit boards are orthogonal in a device casing, the first and second capacitors are arranged so as to surround the heatsink mounted on the first printed circuit board, and the first printed circuit board, the first capacitors, the second printed circuit board, the second capacitors, and a device-casing side surface form a cooled wind channel from a fan.

Also, in order to solve the above problem, according to one embodiment, the second printed circuit board is arranged in a vacant space in a device casing on an upper portion of the first printed circuit board.

Also, in order to solve the above problem, according to one embodiment, cooled wind suctioned by the fan so as to cool an electronic component mounted on the first printed circuit board is guided onto the first printed circuit board by using arc portions of cylindrical shapes of the first capacitors, electronic components mounted on the first printed circuit board are separated into high-heat-generating components and low-heat-generating components so as to be mounted by using a tandem arrangement of the first capacitors as a boundary; and arrangement positions of the first capacitors are adjusted and arranged so that amounts of cooled wind in accordance with the amounts of heat generated by the high-heat-generating components and the low-heat-generating components are guided to respective areas that are divided into an area for mounting the high-heat-generating components and an area for mounting the low-heat-generating components.

Also, in order to solve the above problem, embodiments of the invention include an arrangement method of a heat generating component in a power source apparatus that is provided with at least a heatsink to which a discrete semiconductor device is attached, first and second capacitors made of electrolytic capacitors for DC smoothing, and a cooling fan for forcibly air-cooling the heatsink and the first and second capacitors, and that comprises a first printed circuit board on which the heatsink and the first capacitors are mounted and a second printed circuit board on which the second capacitors are mounted, the method including: arranging the first and second printed circuit boards so that the first and second printed circuit boards are orthogonal in a device casing; arranging the second printed circuit board in a vacant space in a device casing on an upper portion of the first printed circuit board; and arranging first and second capacitors so as to surround the heatsink mounted on the first printed circuit board and forming a cooled wind channel from a fan by the first printed circuit board, the first capacitors, the second printed circuit board, the second capacitors, and a device-casing side surface.

Also, in order to solve the above problem, embodiments of the invention include an arrangement method of a heat generating component in a power source apparatus that is provided with at least a heatsink to which a discrete semiconductor device is attached, first and second capacitors made of electrolytic capacitors for DC smoothing, and a cooling fan for forcibly air-cooling the heatsink and the first and second capacitors, and that comprises a first printed circuit board on which the heatsink and the first capacitors are mounted and a second printed circuit board on which the second capacitors are mounted, the method including: separating electronic components mounted on the first printed circuit board into high-heat-generating components and low-heat-generating components so as to mount the components by using a tandem arrangement of the first capacitors as a boundary; guiding cooled wind suctioned by the fan so as to cool an electronic component mounted on the first printed circuit board onto the first printed circuit board by using arc portions of cylindrical shapes of the first capacitors; and adjusting and arranging arrangement positions of the first capacitors so that amounts of cooled wind in accordance with the amounts of heat generated by the high-heat-generating components and the low-heat-generating components are guided to respective areas that are divided into an area for mounting the high-heat-generating components and an area for mounting the low-heat-generating components.

The present invention can efficiently suppress a temperature increase in a heat generating member (such as a heatsink to which a semiconductor device is attached and a capacitor (electrolytic capacitor) that performs DC smoothing) when the heat generating member is forcibly cooled with outer air suctioned by a fan, and can realize a reduction in size and cost of the device.

DESCRIPTION OF THE PREFERRED EMBODIMENTS

Figure 1:
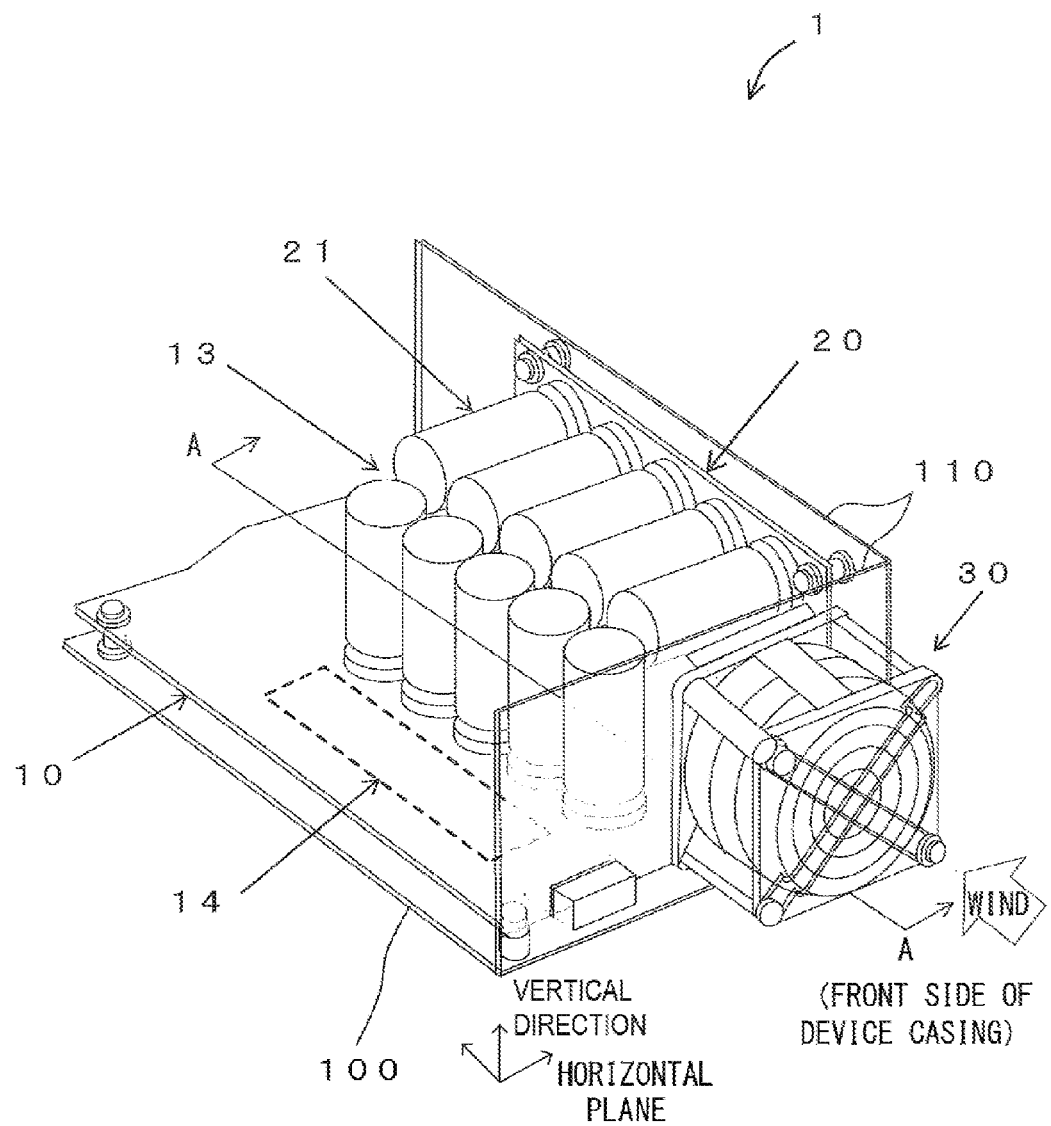
FIG. 1 is a front perspective view showing a configuration example of a power source apparatus of an embodiment of the present invention.

Hereinafter, the embodiments of the present invention will be explained by referring to the drawings.

Figure 2:
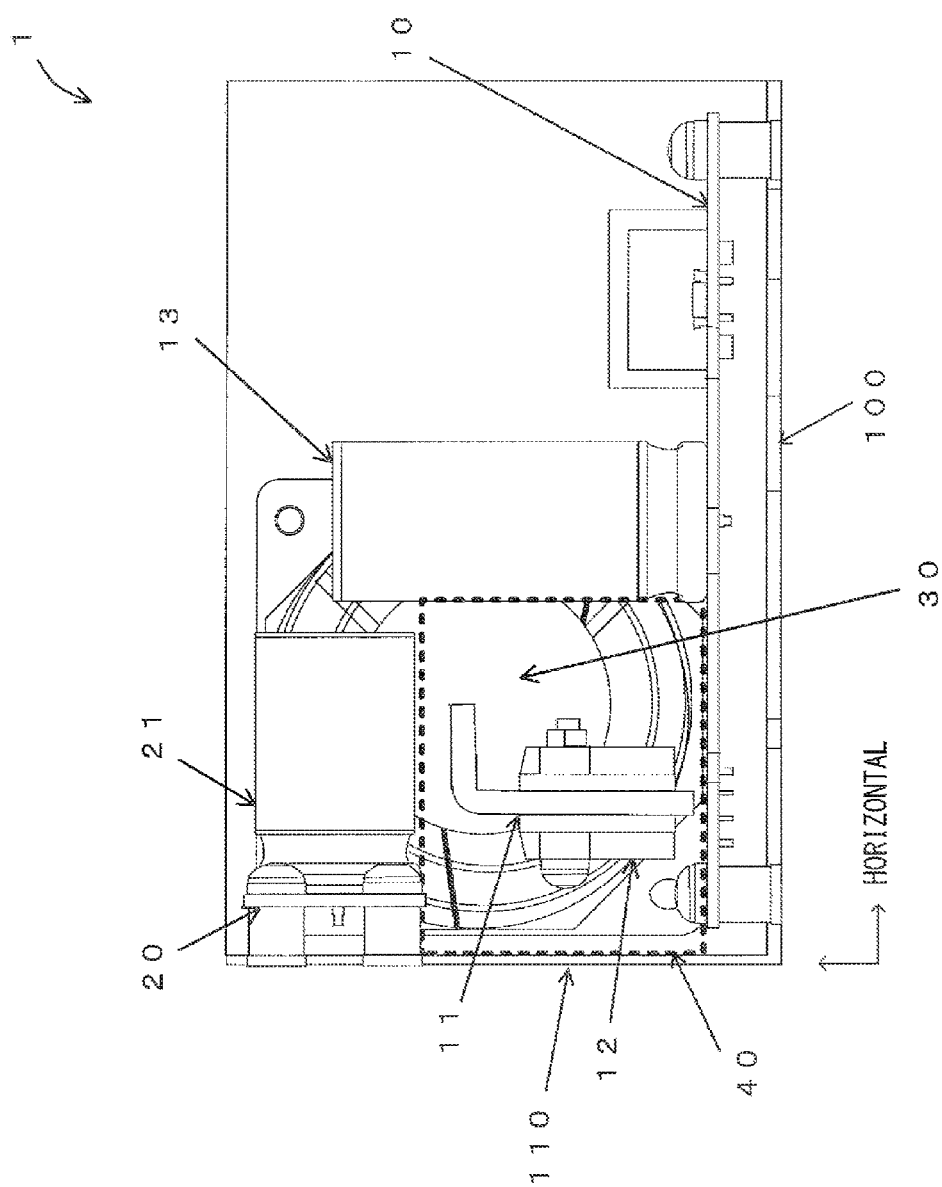
FIG. 2 is a rear perspective view of the power source apparatus of the embodiment of the present invention shown in FIG. 1.

FIG. 1 is a front perspective view showing a configuration example of a power source apparatus 1 of an embodiment of the present invention. FIG. 2 is a rear perspective view of the power source apparatus 1 of the embodiment of the present invention shown in FIG. 1.

In FIG. 1 and FIG. 2, a first printed circuit board 10 on which a heatsink 11 (FIG. 2) having a discrete semiconductor device 12 (FIG. 2) attached to it and first electrolytic capacitors (first capacitors) 13 for smoothing an electric current after a conversion from AC (not shown) to DC (not shown) are mounted is arranged in the horizontal direction of a bottom portion 100 in a device casing.

Also, on the first printed circuit board 10, various electronic components 14 (not shown in detail) such as a resistor, a diode, a capacitor, a coil, etc. are mounted in addition to the heatsink 11 (FIG. 2) and the first capacitors 13. According to an embodiment of the present invention, the electronic components consist of surface-mounted elements that are electrically and physically connected to the first printed circuit board 10 with solder or another electro-mechanical attaching medium.

Also, as shown in FIG. 2, a second printed circuit board 20 is mounted to the side surface portion of the device casing 110 above the heatsink 11. Second electrolytic capacitors (second capacitors) 21 are mounted to the second printed circuit board 20. The second capacitors 21 may be for performing smoothing upon a conversion from AC (not shown) to DC (not shown). The second capacitors 21 are mounted orthogonally to the first printed circuit board 10 in the device.

Thereby, as shown in FIG. 2, the first capacitors 13 mounted on the first printed circuit board 10 and the second capacitors 21 mounted on the second printed circuit board 20 are arranged in the device casing in such a manner that they surround the heatsink 11 to which the semiconductor device 12 mounted on the first printed circuit board 10 is attached, and the first printed circuit board 10, the first capacitors 13, the second printed circuit board 20, the second capacitors 21 and a device-casing side surface portion 110 form a wind tunnel 40 (cooled wind channel) from the fan 30, as shown in FIG. 2.

This configuration makes it possible to make cooled wind from the fan 30 effectively contact the heatsink 11 (which is a heat generating component) and the capacitors 13 and 21, and an additional member for forming the wind tunnel 40 (cooled wind channel) is not used, and also some of electrolytic capacitors, which were to be mounted on the first printed circuit board 10 inherently, are mounted on the second printed circuit board 20 arranged by using the in-device-casing vacant space (FIG. 2), and thereby a reduction in size and cost of the device can be realized.

Figure 3:
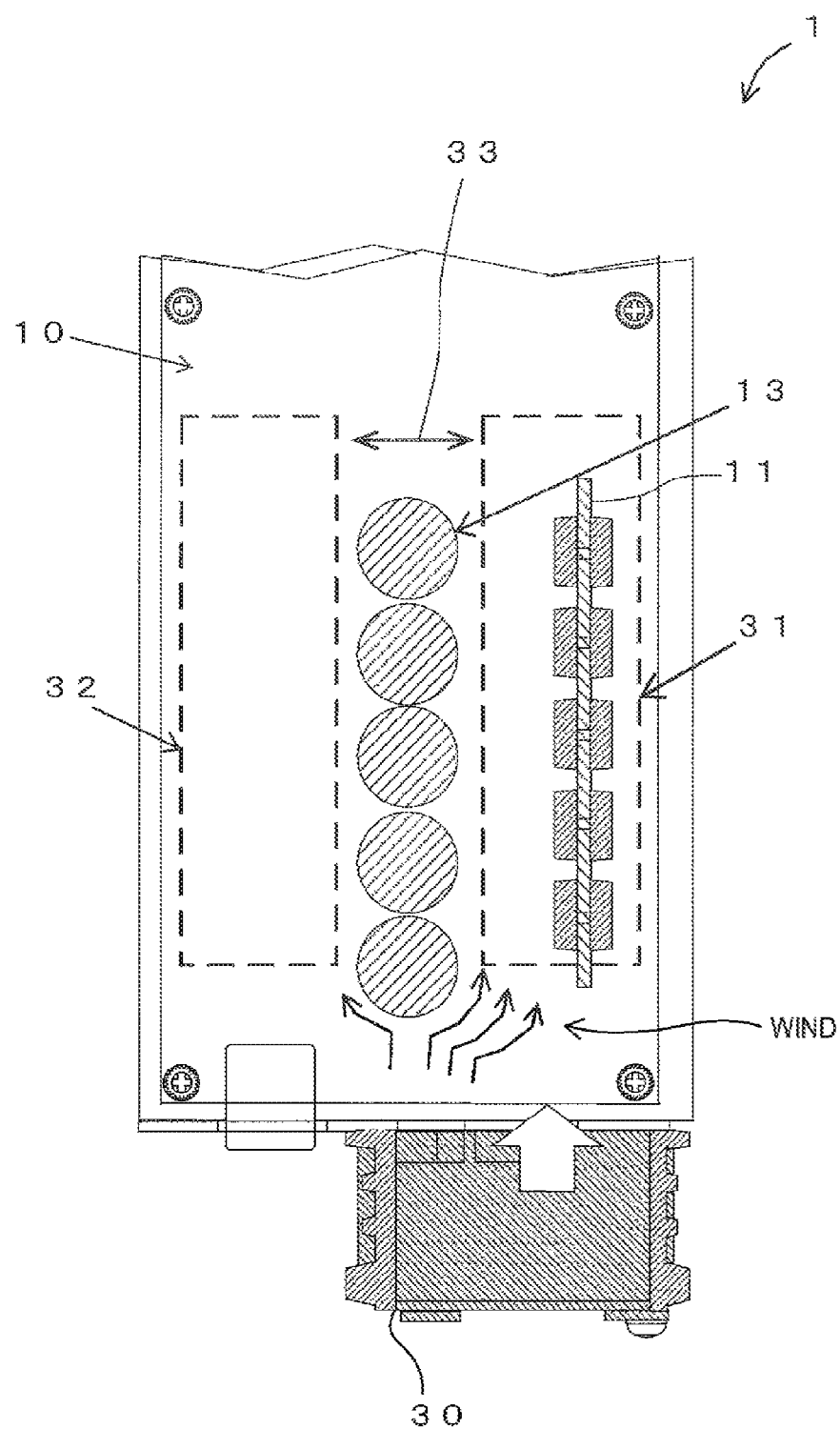
FIG. 3 shows a planar-sectional example of a power source apparatus of the embodiment of the present invention shown in FIG. 1.

FIG. 3 shows a planar-sectional example of a power source apparatus of the embodiment of the present invention shown in FIG. 1, and shows the power source apparatus viewed from above on the section along line A-A in FIG. 1.

In the planar-sectional example shown in FIG. 3, the arrangement positions of the first capacitors 13 mounted on the first printed circuit board 10 can be optimized as the arrangement for the capacitors by adjusting the arrangement positions of the first capacitors 13 mounted on the first printed circuit board 10 in accordance with an area on which a high-heat-generating component is mounted, i.e., a high-heat-generating component area 31 and an area in which a low-heat-generating component is mounted, i.e., a low-heat-generating area 32. In one embodiment, the high-heat-generating components in the high-heat-generating component area 31 are semiconductor switching elements, including one or more processors, one or more field gate arrays, one or more memory chips, and one or more logic chips; and the low-heat-generating components mounted in the low-heat-generating component area 32 include passive electrical elements, including resistors, capacitors, inductors, and diodes.

In other words, numeral 33 in FIG. 3 denotes a scope within which the arrangement positions of the capacitors can be adjusted, and within this scope, the arrangement positions of the first capacitors 13 are adjusted to the optimum one as the arrangement for capacitors.

As a result of this, cooled wind guided from the fan 30 for cooling the electronic components mounted on the first printed circuit board 10 is guided onto the first printed circuit board 10 by using the arc portions of the cylindrical shapes of the first capacitors 13 arranged in tandem. In other words, the fan 30 and the first capacitors 13 are arranged in such a manner that more wind is provided from the fan 30 to the high-heat-generating component area 31 than to the low-heat-generating component area 32. In addition, the fan 30 and the first capacitors 13 are arranged such that an arc of the cylindrical shape of the first capacitors 13 aids in the flow of air from the fan 30 to the high-heat-generating component area 31.

Also, the electronic components mounted on the first printed circuit board 10 are grouped into high-heat-generating components including the semiconductor device 12 and low-heat-generating components including electronic components (not shown), and are separately mounted by using the tandem arrangement of the first capacitors 13 as the boundary.

The tandem arrangement is adjusted in accordance with the ratio of the amounts of the heat generated by the electronic components in the respective areas so that the amounts of cooled wind are guided to the high-heat-generating component area 31 and the low-heat-generating component 32 on the first printed circuit board 10 in accordance with the amounts of the heat generated by the electronic components, such as 80% of the entire wind amount to the high-heat-generating component area 31 and 20% of the entire wind amount to the low-heat-generating component 32, so that the cooled wind amount is guided by using the arc portions of the cylindrical shapes of the first capacitors 13.

This can further increase the cooling efficiency of the entire device by arranging the first capacitors 13 in the optimum positions.

Industrial Applicability

The technique of the present invention has been explained for cooling of a power source apparatus, but it can also be applied to cooling of an electronic motor drive device, a system connection device, etc.

What is claimed is:

1. A power source apparatus, comprising:
   a heatsink to which a discrete semiconductor device is attached;
   first capacitors and second capacitors made of electrolytic capacitors for DC smoothing;
   a cooling fan for forcibly air-cooling the heatsink and the first capacitors and second capacitors; and
   a first printed circuit board on which the heatsink and the first capacitors are mounted, and a second printed circuit board on which the second capacitors are mounted,
   wherein the first and second printed circuit boards are arranged orthogonally to each other in a device casing of the power source apparatus, and
   the first capacitors and second capacitors are arranged so as to define two walls of a wind channel from the cooling fan over the heatsink mounted on the first printed circuit board.

2. The power source apparatus according to claim 1, wherein the second printed circuit board is arranged in on the device casing on an upper portion of the first printed circuit board.

3. The power source apparatus according to claim 1, wherein cooled wind suctioned by the fan so as to cool an electronic component mounted on the first printed circuit board is guided onto the first printed circuit board by using arc portions of cylindrical shapes of the first capacitors,
   electronic components mounted on the first printed circuit board are separated into high-heat-generating components on one side of the first capacitors and low-heat-generating components on an opposite side of the first capacitors; and
   the first capacitors are arranged on the first circuit board so that amounts of cooled wind from the cooling fan are provided to the high-heat-generating components and the low-heat-generating components in proportion to amounts of heat generated by the high-heat-generating components and the low-heat-generating components.

4. An arrangement method of a heat generating component in a power source apparatus that is provided with at least a heatsink to which a discrete semiconductor device is attached, first capacitors and second capacitors made of electrolytic capacitors for DC smoothing, and a cooling fan for forcibly air-cooling the heatsink and the first and second capacitors, and that comprises a first printed circuit board on which the heatsink and the first capacitors are mounted and a second printed circuit board on which the second capacitors are mounted, the method comprising:
   arranging the first and second printed circuit boards so that the first and second printed circuit boards are orthogonal in a device casing;
   arranging the second printed circuit board in the device casing on an upper portion of the first printed circuit board; and
   arranging the first capacitors and the second capacitors on the first circuit board and the second circuit board, respectively, so as to define two walls of a wind channel from the cooling fan over the heatsink mounted on the first printed circuit board.

5. An arrangement method of a heat generating component in a power source apparatus that is provided with at least a heatsink to which a discrete semiconductor device is attached, first capacitors and second capacitors made of electrolytic capacitors for DC smoothing, and a cooling fan for forcibly air-cooling the heatsink and the first and second capacitors, and that comprises a first printed circuit board on which the heatsink and the first capacitors are mounted and a second printed circuit board on which the second capacitors are mounted, the method comprising:
   separating electronic components to be mounted on the first printed circuit board into high-heat-generating components and low-heat-generating components so as to mount the high-heat-generating components on one side of the first capacitors and to mount the low-heat-generating components on an opposite side of the first capacitors;
   arranging the first capacitors on the first circuit board so that amounts of cooled wind supplied to the high-heat-generating components and the low-heat-generating components, respectively, is proportional to an amount of heat generated by the high-heat-generating components and the low-heat-generating components, respectively,
   wherein the first capacitors are arranged on the first circuit board such that the cooled wind generated by the fan is guided to the high-heat-generating components and the low-heat-generating components, respectively, by an arc portion of a cylindrical shape of one of the first capacitors.

* * * * *